(12) United States Patent
Fiolka

(10) Patent No.: US 7,787,104 B2
(45) Date of Patent: Aug. 31, 2010

(54) ILLUMINATION OPTICS FOR A MICROLITHOGRAPHIC PROJECTION EXPOSURE APPARATUS

(75) Inventor: Damian Fiolka, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/536,925

(22) Filed: Aug. 6, 2009

(65) Prior Publication Data

US 2010/0039636 A1    Feb. 18, 2010

(30) Foreign Application Priority Data

Aug. 12, 2008    (DE) ........................ 10 2008 041 179

(51) Int. Cl.
G03B 27/54    (2006.01)
(52) U.S. Cl. .......................................... 355/67; 355/71
(58) Field of Classification Search .................. 355/67, 355/71; 359/17, 18, 203.1, 558, 569
See application file for complete search history.

(56) References Cited

U.S. PATENT DOCUMENTS

| | | | |
|---|---|---|---|
| 4,858,003 A | 8/1989 | Wirt et al. | |
| 6,466,303 B1 | 10/2002 | Omura et al. | |
| 6,836,365 B2 * | 12/2004 | Goto | 359/569 |
| 7,095,560 B2 * | 8/2006 | Toyoda et al. | 359/558 |
| 7,265,816 B2 | 9/2007 | Tsuji | |
| 2003/0156266 A1 * | 8/2003 | Tanitsu | 355/67 |
| 2006/0072095 A1 | 4/2006 | Kudo et al. | |
| 2006/0083996 A1 | 4/2006 | Kim | |
| 2006/0158624 A1 | 7/2006 | Toyoda | |
| 2006/0170901 A1 * | 8/2006 | Tanitsu et al. | 355/71 |
| 2007/0058151 A1 | 3/2007 | Eurlings et al. | |
| 2007/0211231 A1 | 9/2007 | Suda | |

FOREIGN PATENT DOCUMENTS

DE    24 04 716    8/1975

\* cited by examiner

*Primary Examiner*—Edward J Glick
*Assistant Examiner*—Steven H Whitesell-Gordon
(74) *Attorney, Agent, or Firm*—Fish & Richardson P.C.

(57) ABSTRACT

Illumination optics for a microlithographic projection exposure apparatus is used for illumination of an object field in the object plane with illumination light of a radiation source. The illumination optics has an optical beam influencing element which is divided into at least two beam influencing regions in order to generate various illumination modes for the object field which are independent of a light attenuation. The optical beam influencing element is displaceable between a first beam influencing position where a first one of the beam influencing regions is exposed to a bundle of the illumination light, and at least another beam influencing position where another one of the beam influencing regions is exposed to the bundle of the illumination light. Each of the beam influencing regions has a surface which is exposable to illumination light and has a long and a short side length, with the optical beam influencing element being displaceable perpendicular to the long side length. The result is an illumination optics which allows rapid switching between various illumination settings, preferably within fractions of a second and substantially without light loss.

19 Claims, 4 Drawing Sheets

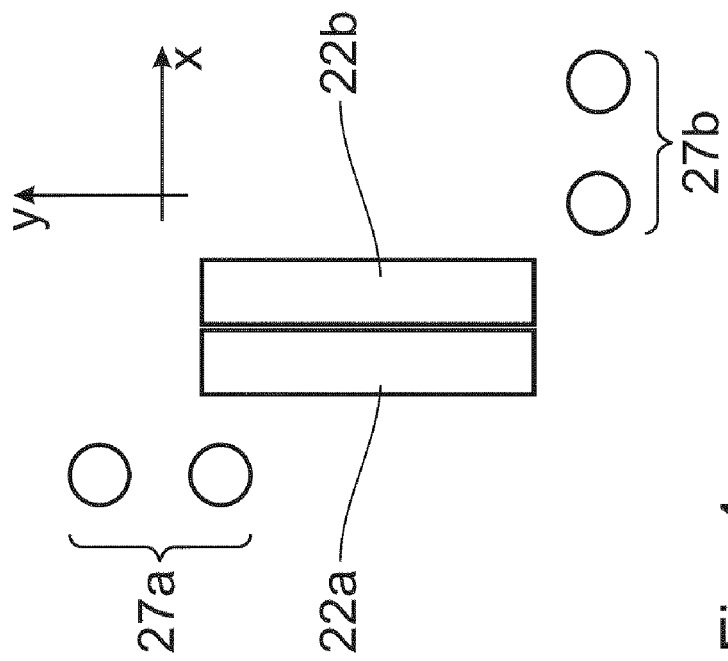
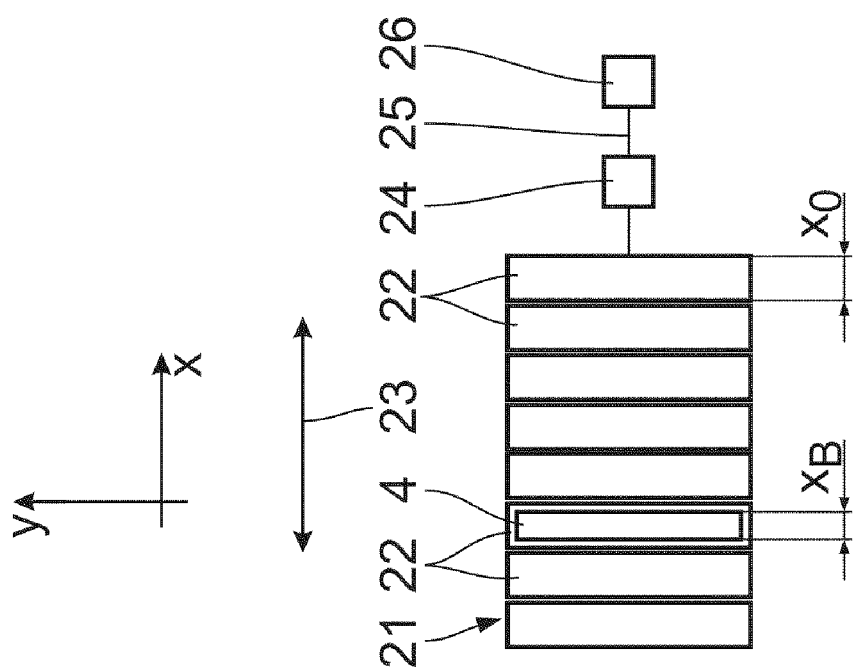

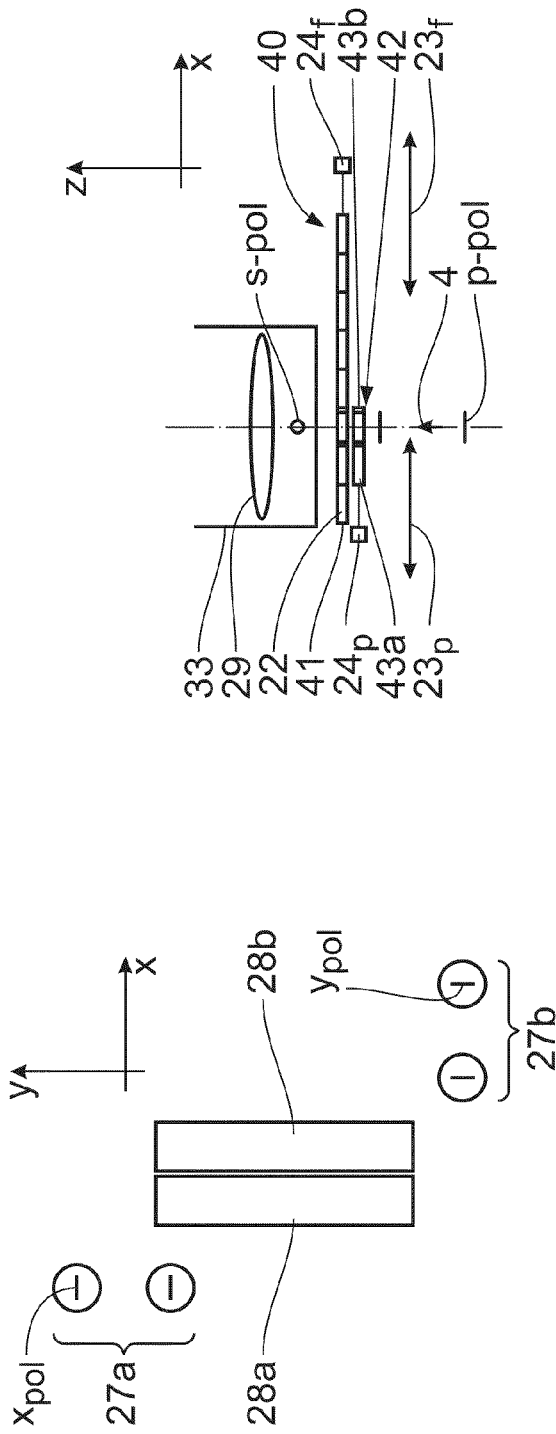
Fig. 6
Fig. 5
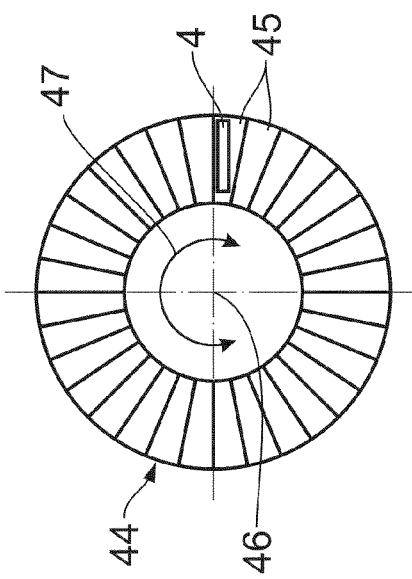
Fig. 7

ILLUMINATION OPTICS FOR A MICROLITHOGRAPHIC PROJECTION EXPOSURE APPARATUS

CROSS-REFERENCE TO RELATED APPLICATIONS

This applications claims priority under 35 U.S. C. §119 to German Patent Application DE 10 2008 041 179.5, filed Aug. 12, 2008. The contents of DE 10 2008 041 179.5 are incorporated herein by reference in its entirety.

FIELD

The disclosure relates to an illumination optics for a microlithographic projection exposure apparatus. The disclosure further relates to an optical beam influencing element for use in an illumination optics of this type, an illumination system comprising an illumination optics of this type, a projection exposure apparatus comprising an illumination system of this type, a production method for a microstructured or nanostructured component using a projection exposure apparatus of this type and a component produced according to this production method.

BACKGROUND

An illumination optics for a microlithographic projection exposure apparatus is disclosed in US 2006/0072095 A1, in US 2007/0211231 A1, in US 2007/0058151 A1 and in US 2006/0158624 A1.

As far as the microlithographic production of semiconductor components and other finely structured components is concerned, the performance of projection exposure apparatuses is essentially determined by the imaging properties of the projection objectives. Moreover, the image quality, the process flexibility, the wafer throughput that is achievable using the apparatus, and other performance features are essentially determined by properties of the illumination system, i.e., the illumination optics and the radiation source, disposed upstream of the projection objective. The illumination optics should be capable of preparing the light of a primary light source such as a laser at the highest possible efficiency so as to generate the most uniform possible intensity distribution in an object or illumination field of the illumination system. Furthermore, the illumination system should be able to generate various modes of illumination so as to optimize the illumination in terms of the structures of the individual templates, in other words masks or reticles, to be imaged. Conventional setting possibilities include various conventional illumination settings having different degrees of coherence as well as annular field illuminations and dipole or quadrupole illumination. Non-conventional illumination settings for generating an oblique illumination may for instance be employed to achieve an increased depth of field using two-beam interference or an increased resolution capability. The generation of various illumination modes for the object field using the at least two beam influencing regions of the optical beam influencing element may be independent of a light attenuation. This is achievable by a diffractive, refractive or reflective generation in the beam influencing regions.

Rapid modifications of the illumination setting allowing a mask in the object field to be exposed to two different illumination settings in short intervals may be desired to perform multiple patternings. The possibilities of conventional illumination optical systems comprising variably adjustable pupil forming devices are limited in this regard, in particular if the masses of the displaceable optical components need to travel relatively long travel distances in order to switch between different illumination settings. When exchangeable pupil filters are used, this may result in light losses.

SUMMARY

In certain aspects, illumination optics are provided for a microlithographic projection exposure apparatus which enables rapid switching between various illumination settings to be carried out preferably within fractions of a second and substantially without light loss.

In certain aspect, the invention features an illumination optics for a microlithographic projection exposure apparatus for the exposure of an object field disposed in an object plane to illumination light of a radiation source,
  with the illumination optics comprising an optical beam influencing element which is divided into at least two beam influencing regions for the generation of various illumination modes for the object field independently of a light attenuation;
  with the optical beam influencing element being displaceable between
    a first beam influencing position where a first one of the beam influencing regions is exposed to a bundle of the illumination light;
    at least another beam influencing position where another one of the beam influencing regions is exposed to the bundle of the illumination light,
  with each of the beam influencing regions comprising a surface which is exposable to illumination light and has a long and a short side length, with the optical beam influencing element being displaceable perpendicular to the long side length.

Embodiments of the beam influencing element include several beam influencing regions, with one of the various beam influencing regions being selectable for exposure to the illumination light bundle by displacing the beam influencing element. As the beam influencing regions generate various illumination modes for the object field, this allows one to switch between the illumination modes. The beam influencing regions have a beam influencing effect which is independent of a light attenuation. Examples of such a beam influencing effect which is independent of the attenuation of the illumination light include a reflective, a refractive or a diffractive effect. The beam influencing regions can therefore not be regarded as filters for the illumination light. The beam influencing element may comprise two beam influencing regions or even more than two beam influencing regions such as three, four, five, eight, ten or even more beam influencing regions. As the surface of the beam influencing regions is in each case designed such as to comprise a long and a short side length, a short travel distance is achievable by displacing the beam influencing element perpendicular to the long side length, which in turn results in short switching times. An aspect ratio between the long and the short side length may be greater than 1.5, greater than 2, greater than 3, greater than 4, greater than 5 or even greater than 8 or 10.

The optical beam influencing element may comprise an optical beam forming element which is divided into at least two beam forming regions for the generation of various beam angle distributions of the illumination light,
  with the beam forming element being displaceable between
    a first beam forming position where a first one of the beam forming regions is exposed to the bundle of the illumination light;

at least another beam forming position where another one of the beam forming regions is exposed to the bundle of the illumination light.

Alternatively, the optical beam influencing element may comprise an optical polarisation forming element which is divided into at least two polarization forming regions for the generation of various polarization distributions of the illumination light, with the optical polarization forming element being displaceable between
a first polarization position where a first one of the polarization forming regions is exposed to the bundle of the illumination light;
at least another polarization position where another one of the polarization forming regions is exposed to the bundle of the illumination light.

Beam influencing elements of this type allow illumination settings to be defined selectively. This may be useful to carry out demanding exposure tasks such as defined multiple patternings of one and the same object structure.

The optical beam influencing element may be arranged in a field plane of the illumination optics, the field plane being conjugated to the object plane. In an arrangement of this type, the beam influencing element only influences the illumination angle. Alternatively, the beam influencing element may also be arranged adjacent to or at a distance from a field plane which is conjugated to the object plane. The beam influencing element is then not only able to influence illumination parameters across the object field but also the shape of the object field; in this case, the main focus may be on influencing the intensity distribution across the object field. Furthermore, the beam influencing element may be arranged in a pupil plane which is optically conjugated to a pupil plane of a projection optics of a projection exposure apparatus, said projection optics being arranged downstream of the illumination optics. In this case, the optical beam influencing element is only able to influence an illumination angle distribution. Finally, the beam influencing element may also be arranged adjacent to or at a distance from such a pupil plane. In this case, the beam influencing element is again able to influence illumination parameters across the object field as well as the shape of the object field and the intensity distribution across the object field; the main focus is then on influencing the illumination angles.

The optical beam influencing element may be a diffractive optical element, with the beam influencing regions being configured as diffractive beam influencing regions. Using beam influencing regions of this type, a beam can be influenced in a defined manner in such a way as to allow even complicated illumination settings such as multipole settings to be performed.

The beam influencing regions may have a different polarizing effect on the illumination light such that the resolution in particular object geometries to be imaged can be improved even more. A polarizing beam influencing region may be configured as a diffractive optical element. Polarizing diffractive optical elements are disclosed in US 2007/0058151 A1 and in US 2006/0158624 A1.

At least one of the beam influencing regions may have a depolarizing effect. This may avoid a preferred direction which may be undesirable in particular exposure tasks. A depolarizing beam influencing region is disclosed in U.S. Pat. No. 6,466,303 B1.

The polarization forming regions may consist of optically active material. Said material may be an optical rotator or a birefringent optical material. If the polarization forming regions are made of optically active material, this ensures a precisely adjustable polarization.

The polarization forming elements may be transmissive and made of material of different thickness. The respective polarizing effect of the polarization forming region is in each case definable by selecting the respective thickness.

The optical beam influencing element may be linearly displaceable in a driven manner and/or displaceable about a pivot axis in a driven manner, wherein in the latter case, the beam forming regions may be arranged about the pivot axis in the form of sector portions when seen in the peripheral direction. Such displacement arrangements of the beam influencing element can be implemented with comparatively little construction effort.

The advantages of an optical beam influencing element for use in an illumination optics correspond to those which have already been explained above with reference to the illumination optics.

The advantages of an illumination system including an illumination optics and a radiation source correspond to those of the illumination optics. The radiation source may be a DUV source or an EUV source.

The forming effect of the illumination system may be such that the illumination light bundle is spanned in the plane of the optical beam influencing element by a longer and a shorter bundle cross-section dimension, with the optical beam influencing element being displaceable in the direction of the shorter bundle cross-section dimension. The ratio of the longer to the shorter bundle cross-section dimension may be greater than 2. The beam influencing regions of the optical beam influencing element may have an extension in the direction of the shorter beam cross-section dimension which exceeds the shorter beam cross-section dimension by no more than 10%. These embodiments ensure particularly short switching times of the beam influencing element when modifying the illumination settings, thus allowing for switching times in the range of milliseconds.

A projection exposure apparatus including an illumination system includes a projection optics for imaging the object field in the object plane into an image field in an image plane, a reticle holder for holding a reticle, which is provided which structures to be imaged, in the object field, and a wafer holder for holding a wafer in the image field, with preferably the reticle holder and the wafer holder being displaceable synchronously with each other in a displacement direction perpendicular to the beam direction of the illumination light during projection exposure. The advantages of a projection exposure apparatus of this type correspond to those which have already been explained above with reference to the components.

The beam forming regions may be rectangular, with the displacement direction of the reticle holder or the wafer holder, respectively, being substantially parallel to the long side lengths of the in particular rectangular beam influencing regions. This ensures a defined illumination of the individual object field points during projection exposure.

The advantages of a method for the production of structured components, the method comprising the following steps:
providing a wafer which is at least partially provided with a layer of a light-sensitive material;
providing a reticle which comprises structures to be imaged;
providing a projection exposure apparatus;
projecting at least a part of the reticle onto a region of the layer on the wafer using the projection exposure apparatus, and the advantages of a component produced according to this method correspond to those which have been explained above with reference to the illumination optics and the projection exposure apparatus.

BRIEF DESCRIPTION OF THE DRAWINGS

Embodiments of the disclosure will hereinafter be explained in more detail by means of the drawing in which

FIG. 3 is a plan view of a beam influencing element comprising several beam influencing regions for the generation of various illumination modes for an object field of the projection exposure apparatus;

FIG. 4 is a cutout of the beam influencing element according to FIG. 3 comprising two beam influencing regions, with far field distributions generated by these two beam influencing regions also being shown diagrammatically;

FIG. 5 is another view similar to FIG. 4 of two beam influencing regions of a beam influencing element, with the beam influencing effects thereof, including a polarization influencing effect, also being shown diagrammatically;

FIG. 6 is a view similar to FIG. 2 of a cutout of a beam influencing element comprising an optical beam forming element and an optical polarization forming element; and FIG. 7 is a plan view of another embodiment of an optical beam influencing element.

DETAILED DESCRIPTION

Figure 1:
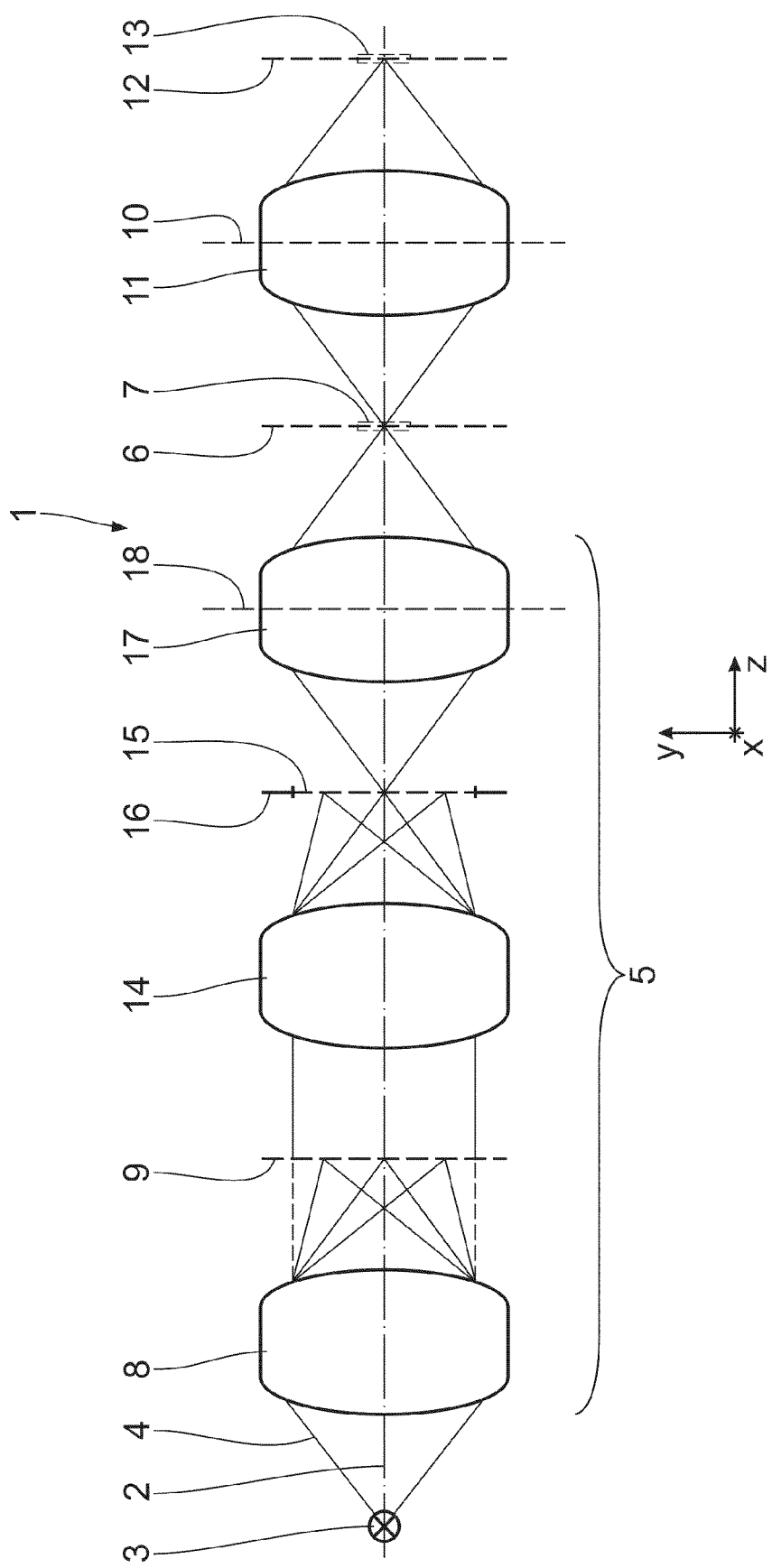
FIG. 1 is a highly diagrammatic meridional section through optical main components of a projection exposure apparatus for microlithography.

FIG. 1 is a diagrammatic meridional section through the optical main groups of a projection exposure apparatus 1. The optical main groups are refractive optical elements in this diagrammatic illustration. The optical main groups may however just as well be diffractive or reflective components or combinations or subcombinations of refractive/diffractive/reflective assemblies of optical elements.

Each of the Figures is provided with a Cartesian xyz coordinate system so as to facilitate the description of positional relationships. The x-axis of FIG. 1 extends perpendicular to and into the drawing plane. The y-axis of FIG. 1 extends upwards. The z-axis of FIG. 1 extends to the right and parallel to an optical axis 2 of the projection exposure apparatus 1. As shown in Figures yet to be described, the optical axis 2 can optionally be folded once or several times.

The projection exposure apparatus 1 comprises a radiation source 3 which generates useful light in the form of a bundle 4 of illumination or imaging rays. The useful light 4 has a wavelength in the deep ultraviolet range (DUV), for instance in the range between 100 and 200 nm. Alternatively, the useful light may also have a wavelength in the EUV range, in particular in the range between 5 and 30 nm.

An illumination optics 5 of the projection exposure apparatus 1 transmits the useful light 4 from the radiation source 3 to an object plane 6 of the projection exposure apparatus 1. In the object plane 6 is arranged an object in the form of a reticle 7 to be imaged using the projection exposure apparatus 1. The reticle 7 is outlined by dashed lines in FIG. 1. The reticle 7 is held by a reticle holder (not shown) of the projection exposure apparatus 1. An object field, which is for example rectangular, is illuminated in the object plane 6.

The illumination optics 5 and the radiation source 3 are together also referred to as illumination system of the projection exposure apparatus 1.

The first optical main group of the illumination optics 5 is a pupil forming optics 8. Said pupil forming optics 8 serves to generate a defined intensity distribution of the useful light 4 in a downstream pupil plane 9 of the illumination optics 5. The pupil forming optics 8 images the radiation source 3 in a plurality of secondary light sources. The pupil forming optics 8 may additionally also have a field forming effect. As will be explained below, the pupil forming optics 8 may be equipped with a diffractive optical element. Alternatively or in addition thereto, the pupil forming optics 8 may also be equipped with pupil-forming optical elements in the form of facet elements or honeycomb elements. The pupil plane 9 is optically conjugated to another pupil plane 10 of a projection objective 11 of the projection exposure apparatus 1, the projection objective 11 being arranged downstream of the illumination optics 5 between the object plane 6 and an image plane 12.

In the image plane 12 is arranged a wafer 13 which is outlined by dashed lines in FIG. 1. Using the projection objective 11, the object field in the object plane 7 is imaged into an image field on the wafer 13 in the image plane 12. The wafer 13 is held by a wafer holder of the projection exposure apparatus 1, the wafer holder not being shown in the drawing.

During projection exposure, the reticle 7 and the wafer 13 are scanned synchronously with each other in the y-direction. A so-called stepper operation of the projection exposure apparatus 1 is conceivable as well where the reticle 7 and the wafer 13 are gradually displaced synchronously with each other in the y-direction between two exposures. The y-direction is therefore an object displacement direction of the projection exposure apparatus 1.

Downstream of the pupil plane 9 that is arranged behind the pupil forming optics 8 is disposed another optical main group of the illumination optics 5 in the form of a field lens group 14. The field lens group 14 has an object-field forming effect. The field lens group 14 may be additionally be provided with a diffractive field forming element. A microlens array may be part of the field lens group 14 as well. Behind the field lens group 14 is arranged an intermediate image plane 15 which is conjugated to the object plane 6. In the intermediate image plane 15 is disposed a diaphragm 16 which defines an edge boundary of the object field to be illuminated in the object plane 6. The diaphragm 16 is also referred to as REMA diaphragm (reticle masking system for masking the reticle 7).

The intermediate image plane 15 is imaged into the object plane 6 using an objective group 17 which is also referred to as REMA lens group. The objective group 17 is another optical main group of the illumination optics 5. In the objective group 17 is arranged another pupil plane 18 of the illumination optics 5.

Figure 2:
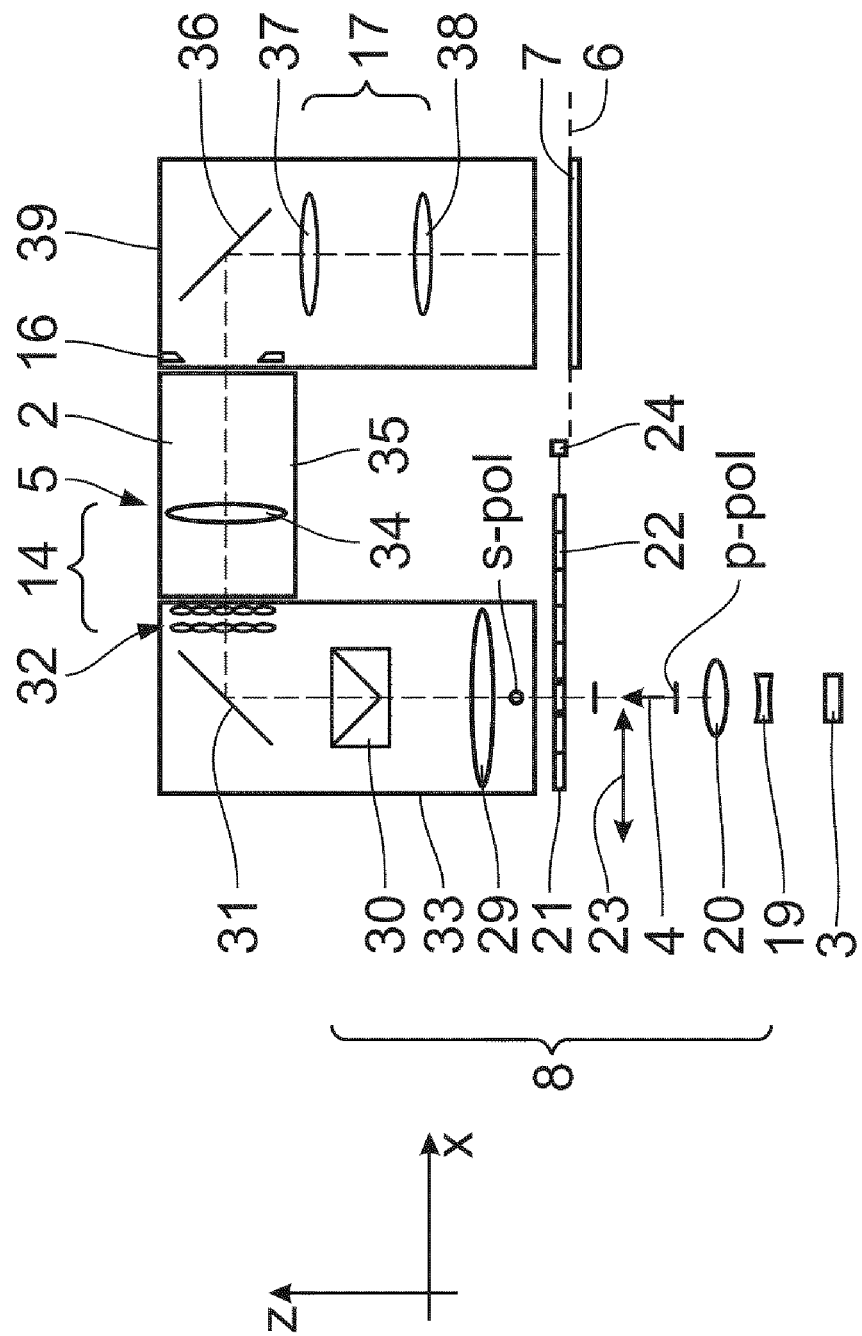
FIG. 2 is a highly diagrammatic view of an embodiment of a modular illumination system for the projection exposure apparatus according to FIG. 1, with optical components inside the modules being exposed.

FIG. 2 is a partially more detailed view of an embodiment of the illumination optics 5. First of all, the pupil forming optics 8 includes a beam expansion optics which is configured as a Galilei telescope comprising lenses 19, 20. A typical expansion factor of this expansion optics 19, 20 is between 2 and 5. Behind the expansion optics 19, 20, the useful light 4 impinges upon a row array 21 of diffractive optical elements (DOEs) 22. The array 21 is an optical beam influencing element, with the individual DOEs 22 forming beam influencing regions of the beam influencing element 21 for generating various illumination modes for the object field. In front of the array 21, the useful light 4 is polarized in a direction that is linearly parallel to the drawing plane of FIG. 2 (p-pol). The DOE 22, which is currently passed through by light in the arrangement according to FIG. 2, causes the polarization of the useful light 4 to be rotated. Behind the array 21, the useful light 4 is polarized in a direction that is linearly perpendicular to the drawing plane of FIG. 2 (s-pol).

FIG. 3 shows a current illumination mode of the beam influencing element 21. There are eight beam influencing regions 22 in FIG. 3 which are arranged next to one another in the x-direction, with the third beam influencing region 22 to the left being exposed to the bundle 4 of useful radiation. The beam influencing regions 22 comprise in each case one surface that is exposable to the bundle 4 of illumination radiation, the surface comprising a long side length which extends in the y-direction and a short side length which extends in the x-direction. The beam influencing regions 22 are directly adjacent to each other in the x-direction. The beam influencing regions 22 are rectangular and have a y/x aspect ratio of approximately 5.5 in the illustrated embodiment. Other aspect ratios, for instance in the range between 2 and 10, are conceivable as well. The bundle 4 of illumination radiation is also rectangular in the plane of the beam influencing element 21 and is spanned by a longer bundle cross-section dimension extending in the y-direction and a shorter bundle cross-section dimension extending in the x-direction. The ratio of the longer bundle cross-section dimension to the shorter bundle cross-section dimension is approximately 8 in the illustrated embodiment. Other aspect ratios which may be greater than 5 or greater than 2 are conceivable as well. Exactly one of the DOEs 22, in other words exactly one beam influencing region, is exposed to the bundle 4 of useful radiation.

Due to their DOE design, the beam influencing regions 22 have a beam influencing effect which is independent of an attenuation of the bundle 4 of useful radiation. The bundle 4 of useful radiation is therefore influenced by the beam influencing element 21 in such a way that no filtering of the bundle 4 of useful radiation occurs. The DOEs 22 are outlined as transmissive DOEs in FIG. 2. Alternatively, the DOEs 22 may also be designed as reflective DOEs.

The beam influencing element 21 may be arranged in a field plane of the illumination optics 5 which is optically conjugated to the object plane 6. Alternatively, the beam influencing element 21 may also be arranged in an intermediate plane between a field plane conjugated to the object plane and a pupil plane of the illumination optics 5.

The beam influencing regions 22 of the beam influencing element 21 have an extension $x_0$ in the x-direction which exceeds the shorter bundle cross-section dimension $x_B$ of the bundle 4 of useful radiation in the plane of the beam influencing element 21 by no more than 10%. Provided that the beam influencing element 21 is adjusted correctly, this ensures that the bundle 4 of useful radiation is able to impinge upon exactly one of the beam influencing regions 22, thus preventing portions of the useful light 4 from impinging upon the directly adjacent beam influencing regions 22 in an unwanted manner.

The beam influencing element 21 is displaceable in a switching direction 23 which extends parallel to the x-direction. A length of a switching displacement with an absolute value of $x_0$ causes an adjacent one of the beam influencing regions 22 to be exposed to the bundle 4 of useful radiation instead of the beam influencing region 22 exposed thereto in FIG. 3. At a given shorter bundle cross-section dimension $x_B$, the length ratio between the dimensions $x_0$ and $x_B$ ensures that modifying the exposure of the beam influencing regions 22 only requires a short switching travel of the beam influencing element 21 in the switching direction 23.

For displacement in the switching direction 23, the beam influencing element 21 is mechanically connected to a driven retaining element 24 which is diagrammatically shown in FIGS. 2 and 3. A drive motor of the retaining element 24 is connected with a central control device 26 of the projection exposure apparatus 1 via a signal line 25 (cf. FIG. 3).

FIG. 4 shows the beam influencing effect of a first embodiment of the beam influencing regions 22. The Figure shows a slightly enlarged view of two selected beam influencing regions 22a and 22b of the beam influencing element 21. The beam influencing regions 22a, 22b only have a beam forming effect, in other words they do not influence the polarization of the incident bundle 4 of useful radiation.

Apart from the two beam influencing regions 22a, 22b, FIG. 4 also shows the beam influencing effect of far field distributions characterizing these two beam influencing regions 22a, 22b. The beam influencing region 22a shown on the left of FIG. 4 generates a far field distribution 27a in the form of a y-dipole. When the beam influencing region 22a is exposed to the bundle 4 of useful radiation, a corresponding y-dipole illumination of the reticle 7 is generated in the object plane 6.

The beam influencing region 22b shown on the right of FIG. 4 generates a far field distribution 27b in the form of an x-dipole. When the beam influencing region 22b is exposed to the bundle 4 of useful radiation, this results in a corresponding x-dipole illumination of the reticle 7 in the object plane 6.

Alternatively or in addition thereto, the beam influencing element 21 may also comprise polarization forming regions whose rectangular extension in the plane of the beam influencing element 21 is identical to that of the beam influencing regions 22. FIG. 5 is an illustration similar to FIG. 4 of such polarization forming regions 28, shown by the example of two polarization forming regions 28a and 28b. The illumination forming effect of the polarization forming regions 28a, 28b corresponds to that of the beam influencing regions 22a and 22b. The illumination forming effect of the polarization forming region 28a is such that a y-dipole 27a is generated while the illumination forming effect of the polarization forming region 28b is such that an x-dipole 27b is generated. In addition thereto, the polarization forming region shown 28a on the left of FIG. 5 generates a polarization $x_{pol}$ of the useful light 4 in the x-direction while the polarization forming region 28b generates a polarization $y_{pol}$ of the useful light 4 in the y-direction.

The polarization forming regions 28 may be made of optically active material, for instance in the form of an optical rotator or of a birefringent optical material. In order to generate different polarizing effects, the polarization forming regions 28a, 28b may consist of the same material while having a different thickness when seen in the beam direction of the useful light 4. This applies if the polarization forming regions 28 are designed as regions which are transmissive of the useful light 4. In this case, advantage can be taken of a linear or a circular birefringence.

Corresponding polarization forming regions 28 may also have a depolarizing effect, in other words they may influence incident polarized useful light 4 in such a way that said useful light 4 will be depolarized behind the polarization forming regions 28.

Downstream of the beam influencing element 21, the useful light 4 propagates through a lens 29 (cf. FIG. 2) and a zoom axicon 30 which allows illumination angles defined by the beam influencing element 21 to be continuously fine-tuned in the object field. The optical components 19, 20, 21, 20 and 30 are components of the pupil forming optics 8 of the illumination optics 5. Behind the zoom axicon 30, the useful light 4 is reflected by a 90° mirror 31 before passing through a raster element 32 in the form of a honeycomb condenser. The optical components 29 to 32 are combined in a zoom axicon module 33.

Behind the raster element 32, the useful light 4 passes through a field lens 34 which is a part of an input coupling module 35 of the illumination optics 5. The optical components 32 and 34 are parts of the field lens group 14 of the illumination optics 5.

The REMA diaphragm 16 is arranged behind the input coupling module 35. Arranged downstream of said REMA diaphragm 16 is another 90° mirror 36 behind which is arranged the objective group 17 of which two lenses 37, 38 are shown. The optical components 16, 36, 37 and 38 are parts of a REMA module 39 of the illumination optics 5.

During operation of the projection exposure apparatus 1 comprising the illumination optics, 5, the reticle 7 may be subjected to double patterning. To this end, the impingement of a first beam influencing region 22 of the beam influencing element 21 is first determined by corresponding actuation of the drive motor of the retaining element 24 using the control device 26. The reticle 7 is then exposed to the correspondingly formed bundle 4 of illumination radiation. The beam influencing element 21 is then displaced in the switching direction 23 by the drive motor of the retaining element 24 via a switching command of the control device in such a way that a second selected beam forming region 22 of the beam forming element 21 is now exposed to the bundle 4 of illumination radiation, with the bundle 4 of illumination radiation being formed correspondingly in this process. The already illuminated portion of the reticle 7 in the object field of the object plane 6 is then illuminated for a second time. The second selected beam forming region 22 is generally a beam forming region that is directly adjacent to the beam forming region 22 that was first illuminated. It is generally conceivable to skip one beam influencing region 22 or several beam influencing regions 22 when displacing the beam influencing element 21. These two exposures in which illumination is carried out using bundles 4 of illumination radiation with correspondingly different illumination angle distributions may take place in rapid succession, with the beam influencing element 21 being rapidly switched from one position to the other, for example.

FIG. 6 shows another embodiment of a beam influencing element 40. Said beam influencing element 40 not only has a beam forming element 41 comprising beam forming regions 22 corresponding to those that have been explained above with reference to FIGS. 3 and 4 but also a polarization forming element comprising polarization forming regions 43a and 43b. The polarization forming regions 43 are beam forming regions as well and have only a polarizing but no beam forming effect. The polarization forming region 43b shown on the right of FIG. 6 rotates the polarization of the incident useful light 4 through 90°. The situation is shown where p-polarized useful light 4, i.e. incident useful light 4 which is parallel to the drawing plane of FIG. 6, is s-polarized, i.e. in the direction perpendicular to the drawing plane of FIG. 6, after passing through the polarization forming region 43b. The polarization forming region 43a has for example a depolarizing effect, causing p-polarized incident useful light 4 to be depolarized when passing through the polarization forming region 43a, with the result that a depolarized illumination of the object field is achieved in the object plane 6.

The polarization forming element 42 and the beam forming element 41 are arranged one behind the other in the beam direction (z-direction) of the bundle 4 of illumination radiation. The distance between these two elements 42, 41 may amount to several millimetres. Alternatively, the two elements 42, 41 may be arranged at positions in the illumination optics 5 which are at a greater distance from each other.

The beam forming element 41 on the one hand and the polarization forming element 42 on the other are displaceable in switching directions $23_f$ and $23_p$ independently of each other, said switching directions $23_f$, $23_p$ extending parallel to the x-direction. To this end are provided respective retaining elements $24_f$ and $24_p$ whose drives are signally connected with the control device 26 in a manner not shown.

The beam influencing element 40 allows for independent setting of the illumination angle in the object plane 6 on the one hand and of the illumination polarizations in the object plane 6 on the other.

The drive of the retaining element $24_p$ also allows the polarization forming element 42 to be moved out of the beam path of the useful light 4 entirely, with the result that a non-polarizing effect is achieved.

FIG. 7 shows another embodiment of a beam influencing element 44. Components which correspond to those that have already been explained above with reference to FIGS. 1 to 6 are denoted by the same reference numerals and are not discussed in detail again.

Instead of rectangular beam influencing regions 22, beam influencing regions 45 of the beam influencing element 44 have the shape of sector portions which are arranged about a pivot axis 46 of the beam influencing element 44 when seen in the peripheral direction. A switching direction 47 of the beam influencing element 44 extends about the pivot axis 36 in the peripheral direction as well. The beam influencing regions 45 have a beam influencing effect as described above with reference to the various embodiments of the beam influencing regions 22, 28 and 43 according to FIGS. 2 to 6.

The beam influencing element 44 is drivable, via a retaining element (not shown), about the pivot axis 46 using a drive motor.

Said retaining element is again signally connected with the control device 26 of the projection exposure apparatus 1.

The control device 26 again permits actuated switching between the beam influencing regions 45 as described above with reference to the embodiments according to FIGS. 2 to 6.

The above described embodiments of the beam influencing elements are provided with diffractive beam influencing regions. Reflective or refractive beam influencing regions may be provided alternatively or in addition to the diffractive beam influencing regions as well. Alternatively or in addition to beam influencing regions of this type, it is finally conceivable as well to provide beam influencing regions such as gray filters for useful light 4 which attenuate the useful light 4. The exposable surface of the refractive, reflective or filtering beam influencing regions may be dimensioned such as explained above with reference to the embodiments, in other words they may in particular comprise a long and a short side length, with the optical beam influencing element comprising said beam influencing regions then being displaceable perpendicular to said long side length as well.

Other embodiments are in the following claims.

What is claimed is:

1. Illumination optics for a microlithographic projection exposure apparatus for the exposure of an object field disposed in an object plane to illumination light, the illumination optics comprising:
 an optical beam influencing element which is divided into at least two beam influencing regions for the generation of various illumination modes for the object field;
 the optical beam influencing element being displaceable between a first beam influencing position where a first one of the beam influencing regions is exposed to a bundle of the illumination light; and at least another beam influencing position where another one of the beam influencing regions is exposed to the bundle of the illumination light, each of the beam influencing regions comprising a surface which is exposable to illumination light and has a long and a short side length, the optical beam influencing element being displaceable perpendicular to the long side length, wherein:

in a plane of the beam influencing element, the bundle of illumination light has a cross-section with a longer dimension and a shorter dimension; and every beam influencing region of the beam influencing element extends in a direction of the shorter dimension by an amount that exceeds the shorter dimension by no more than 10%.

2. The illumination optics of claim 1, wherein the optical beam influencing element comprises an optical beam forming element which is divided into at least two beam forming regions for the generation of various beam angle distributions of the illumination light, the beam forming element being displaceable between a first beam forming position where a first one of the beam forming regions is exposed to the bundle of the illumination light; and at least another beam forming position where another one of the beam forming regions is exposed to the bundle of the illumination light.

3. The illumination optics of claim 1, wherein the optical beam influencing element comprises an optical polarisation forming element which is divided into at least two polarization forming regions for the generation of various polarization distributions of the illumination light, with the optical polarization forming element being displaceable between a first polarization position where a first one of the polarization forming regions is exposed to the bundle of the illumination light; and at least another polarization position where another one of the polarization forming regions is exposed to the bundle of the illumination light.

4. The illumination optics of claim 1, wherein the optical beam influencing element is arranged in a field plane of the illumination optics, the field plane being conjugated with the object plane.

5. The illumination optics of claim 1, wherein the optical beam influencing element is a diffractive optical element, the beam influencing regions being diffractive beam influencing regions.

6. The illumination optics of claim 1, wherein the beam influencing regions have a different polarizing effect on the illumination light.

7. The illumination optics of claim 1, wherein at least one of the beam influencing regions has a depolarizing effect.

8. The illumination optics of claim 1, wherein the optical beam influencing element comprises an optical polarisation forming element including polarization forming regions comprising optically active material.

9. The illumination optics of claim 1, wherein the optical beam influencing element comprises an optical polarisation forming element including polarization forming regions that are transmissive and comprise material of different thickness.

10. The illumination optics of claim 1, wherein the optical beam influencing element is linearly displaceable in a driven manner.

11. The illumination optics of claim 1, wherein the optical beam influencing element is displaceable about a pivot axis in a driven manner.

12. An illumination system, comprising:
the illumination optics of claim 1; and
a radiation source.

13. The illumination system of claim 12, wherein optical beam influencing element is displaceable in the direction of the shorter dimension.

14. The illumination system of claim 13, wherein a ratio of the longer dimension to the shorter dimension is more than 2.

15. A projection exposure apparatus comprising the illumination system of claim 12;

a projection optics for imaging the object field disposed in the object plane into an image field in an image plane;

a reticle holder for holding a reticle in the object field, the reticle comprising structures to be imaged;

a wafer holder for holding a wafer in the image field.

16. The projection exposure apparatus of claim 15, wherein the beam forming regions are rectangular, with the displacement direction extending parallel to the long side lengths of the beam influencing regions.

17. A method for the production of structured components, the method comprising the following steps:

providing a wafer which is at least partially provided with a layer of a light-sensitive material;

providing a reticle which comprises structures to be imaged;

providing a projection exposure apparatus of claim 16;

projecting at least a part of the reticle onto a region of the layer on the wafer using the projection exposure apparatus.

18. The illumination optics of claim 11, wherein the beam forming regions are arranged about the pivot axis in the form of sector portions when seen in the peripheral direction.

19. The projection exposure apparatus of claim 15, wherein the reticle holder and the wafer holder are synchronously displaceable perpendicular to the beam direction of the illumination light in a displacement direction during projection exposure.

* * * * *

UNITED STATES PATENT AND TRADEMARK OFFICE
CERTIFICATE OF CORRECTION

PATENT NO. : 7,787,104 B2
APPLICATION NO. : 12/536925
DATED : August 31, 2010
INVENTOR(S) : Damian Fiolka It is certified that error appears in the above-identified patent and that said Letters Patent is hereby corrected as shown below:

Column 6,
Line 38, After "may" delete "be"

Column 9,
Line 16, Delete "optics, 5," and insert -- optics 5, --

Column 12,
Line 20, After "wherein" insert -- the --

Signed and Sealed this

Sixteenth Day of November, 2010

David J. Kappos
*Director of the United States Patent and Trademark Office*